United States Patent [19]

Lawton

[11] Patent Number: 4,642,490
[45] Date of Patent: Feb. 10, 1987

[54] AMPLITUDE VARIATION SUPPRESSION ARRANGEMENTS

[75] Inventor: Rodney J. Lawton, Wiltshire, England

[73] Assignee: Plessey Overseas Limited, Ilford, England

[21] Appl. No.: 679,873

[22] Filed: Dec. 10, 1984

[30] Foreign Application Priority Data

Dec. 9, 1983 [GB] United Kingdom ............... 8332897

[51] Int. Cl.⁴ ..................... H03K 5/08; G06G 7/16
[52] U.S. Cl. ............................ 307/540; 307/529; 328/160; 455/210
[58] Field of Search ............ 307/540, 552, 529; 328/160, 164; 455/210

[56] References Cited

U.S. PATENT DOCUMENTS

| | | | |
|---|---|---|---|
| 3,769,597 | 10/1973 | Mayer | 328/160 |
| 3,935,539 | 1/1976 | Linder | 328/160 |
| 3,995,224 | 11/1976 | Sutphin, Jr. | 307/540 |
| 4,388,595 | 6/1983 | Brooks | 328/160 |

Primary Examiner—Stanley D. Miller
Assistant Examiner—B. P. Davis
Attorney, Agent, or Firm—Fleit, Jacobson, Cohn & Price

[57] ABSTRACT

An arrangement for suppressing amplitude variation in FM signals comprises a frequency divider which frequency divides an incoming FM signal to provide frequency divided signals having two discrete levels dependent upon the amplitude of the incoming FM signal in relation to a threshold value, and a frequency multiplier which combines the frequency divided signal to provide an output signal of substantially constant amplitude and having a frequency equal to that of the incoming signal.

2 Claims, 6 Drawing Figures

AMPLITUDE VARIATION SUPPRESSION ARRANGEMENTS

FIELD OF THE INVENTION

This invention relates to amplitude variation suppression arrangements suitable for suppressing amplitude variations in FM radio frequency signals.

In an FM system only the frequency of the carrier is modulated but amplitude variation of the carrier may also occur due to noise.

DESCRIPTION OF THE PRIOR ART

A known type of amplitude variation suppression arrangement for use in FM systems comprises a plurality of amplifying stages. Such an arrangement may have an input/output voltage response such as the one illustrated in FIG. 1 of the accompanying drawings. When an incoming FM signal has an input voltage of $V_1$ or less, the arrangement supplies an output FM signal having a constant amplitude of voltage $V_3$. When the voltage of the incoming FM signal rises above $V_2$, the suppression arrangement supplies an output FM signal having a constant amplitude of voltage $V_4$. When the voltage of the incoming FM signal varies between $V_1$ and $V_2$, the output voltage varies between $V_3$ and $V_4$. Hence, this type of suppression arrangement has the disadvantage that amplitude variation in an incoming FM signal having a low signal-to-noise ratio (that is, one having a voltage which varies between less than $V_1$ and $V_2$) is not suppressed. This type of suppression arrangement can be improved by increasing the number of amplifying stages but this results in an increase in the cost and complexity of the suppression arrangement. Increasing the number of amplifying stages results in a constant amplitude output $V_3$ or $V_4$ for incoming signals having a lower voltage amplitude. This type of suppression arrangement also has the disadvantage that, for low amplitude incoming FM signals, noise generated by the amplifying stages becomes significant in the output FM signal.

Another known type of suppression arrangement is a Schmidt Trigger. A disadvantage with the Schmidt Trigger is that it exhibits hysteresis. FIG. 2 of the accompanying drawings shows an input/output voltage response for a Schmidt Trigger. The hysteresis is represented by the shaded portion of FIG. 2. The Schmidt Trigger switches from one binary state to another when the input voltage reaches $V'_2$ and switches back when the input voltage drops to $V'_1$.

A minimum hysteresis level of between 50–100 mV is obtainable with a Schmidt Trigger. Therefore, a Schmidt Trigger suffers from the disadvantage that incoming FM signals having a voltage amplitude which is lower than the hysteresis level of the Trigger fail to switch the Trigger and hence no output is obtained.

SUMMARY OF THE INVENTION

The present invention seeks to alleviate the above mentioned disadvantages and to provide an amplitude variation suppression arrangement which is of more simple circuit design, and which is sensitive to low amplitude incoming signals.

According to the present invention there is provided an arrangement for suppressing amplitude variation in FM signals, the arrangement comprising a frequency divider which frequency divides an incoming FM signal to provide frequency divided signals having two discrete levels dependent upon the amplitude of the incoming FM signal in relation to a threshold value, and a frequency multiplier which combines the frequency divided signal to provide an output signal of substantially constant amplitude and having a frequency equal to that of the incoming signal.

The frequency divider may be in the form of a D-type bistable operative to frequency divide the incoming FM signal by two to provide two frequency divided signals in phase quadrature with respect to one another.

BRIEF DESCRIPTION OF THE DRAWINGS

The invention will now be described by way of example, with reference to the accompanying drawings, in which.

DETAILED DESCRIPTION OF THE INVENTION

Figure 1:
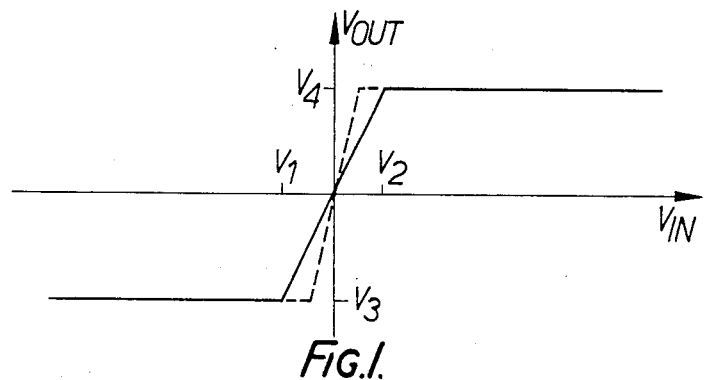
FIG. 1 is an illustration of how input voltage is related to output voltage for an amplitude variation suppression arrangement having a plurality of amplifying stages.
Figure 2:
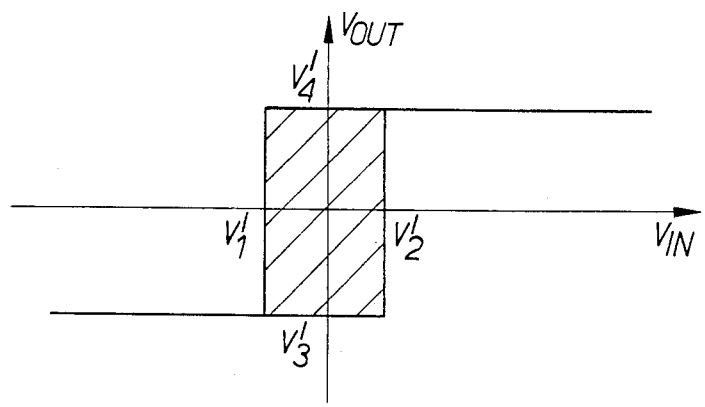
FIG. 2 is an illustration of how input voltage is related to output voltage for a Schmidt Trigger.
Figure 3:
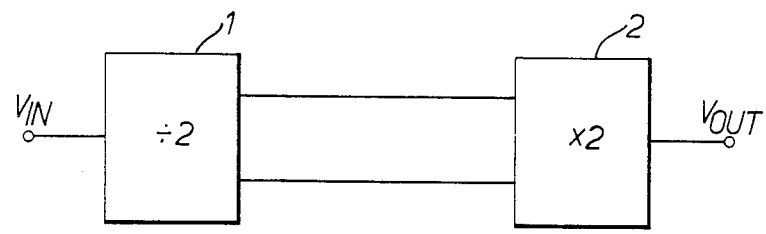
FIG. 3 is a block diagram of an amplitude variation suppression arrangement embodying the present invention.

Referring first to FIG. 3, there is shown an amplitude variation suppression arrangement embodying the present invention which comprises a frequency divider 1 which frequency divides an incoming FM signal received at a terminal $V_{in}$ by 2 to provide two frequency divided signals of substantially constant amplitude. The two frequency divided signals are fed to a ×2 frequency multiplier which combines the frequency divided signals to provide an output FM signal of substantially constant amplitude at a terminal $V_{out}$.

Figure 4:
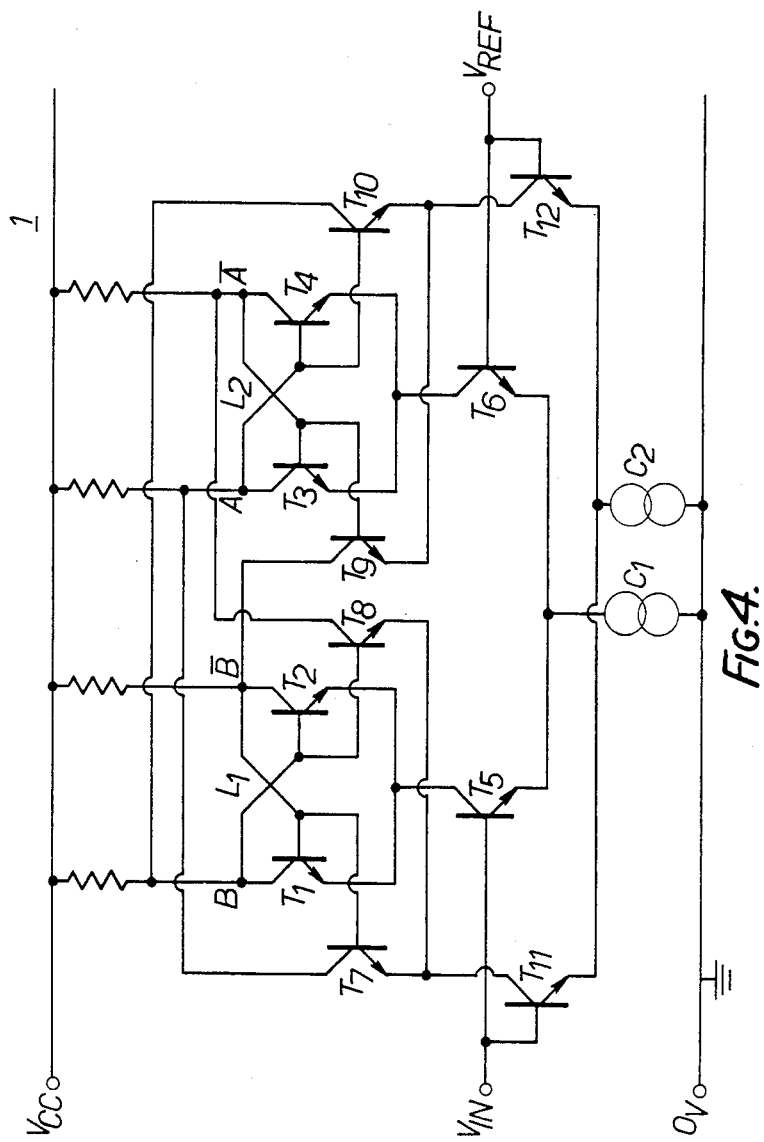
FIG. 4 is a circuit diagram of a divide by two frequency divider of the arrangement of FIG. 3.

FIG. 4 shows a circuit diagram of the divide by 2 frequency divider 1 of FIG. 3. The frequency divider 1 is a D-type bistable and comprises a pair of latches L1 and L2. The latch L1 comprises a pair of transistors T1 and T2 and the latch L2 comprises a pair of transistors T3 and T4. The current is supplied to the latches L1 and L2 by a long tail pair comprising a pair of transistors T5 and T6 and a current source C1. The incoming FM signal is fed via the terminal $V_{in}$ to the transistor T5. The base of the transistor T6 is supplied with a reference voltage $V_{ref}$.

Sensing gates T7, T8 and T9, T10 are operatively associated with the latches L1 and L2, respectively, and they are effective for sensing the state of the latch with which they are associated. That is to say, the sensing gate T7 and T8 senses the state of the latch L1 and is operative to set the state of the latch L1 into the latch L2, and the sensing gate T9 and T10 senses the state of the latch L2 (which state is the inverse of the state of the latch L1) and is operative to set the state of the latch L2 into the latch L1. Each of the sensing gates T7, T8 and T9, T10 is supplied with current from a pair of transistors T11, T12 and a current source C2.

When there is a zero voltage difference between $V_{ref}$ and the incoming FM signal fed in at $V_{in}$, there is no preference for either of the latches L1 or L2 to have a particular state and hence the states of L1 and L2 are indeterminate. When an FM signal having a low amplitude is fed into the frequency divider 1 at $V_{in}$, the latch L1 switches into a particular state according to whether the voltage of the signal is above or below the reference voltage $V_{ref}$. The latch L2 takes the opposite state.

The states of the latches L1 and L2 change when the voltage of the input FM signal changes from above to below (or vice versa) the reference voltage $V_{ref}$. Since the frequency divider 1 has only two possible states, it suppresses amplitude variations in the incoming FM signal and provides outputs having two discrete values.

Figure 5:
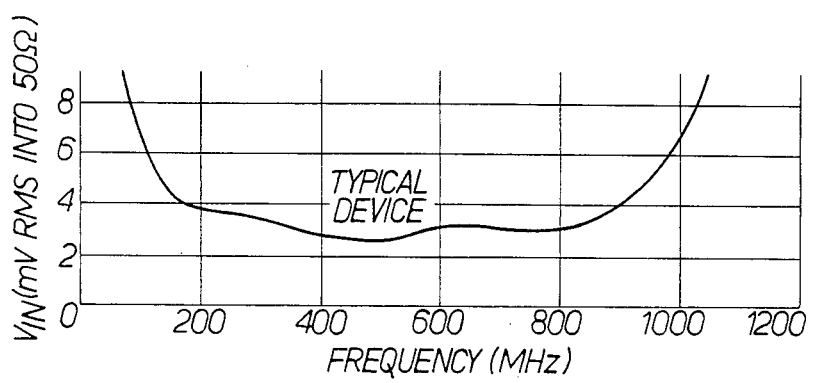
FIG. 5 is a graph showing a typical input sensitivity for a frequency divider.

The frequency divider 1 has a hysteresis level for an incoming signal having a wide bandwidth of about 5 mV (see FIG. 5). When incoming FM signals have a lower amplitude, the latches L1 and L2 of the frequency divider 1 will oscillate between the two states. The two frequency divided signals are fed from terminals $A\overline{A}$ and $B\overline{B}$ to the ×2 multiplier 2 of FIG. 3.

FIG. 5 is a graph showing a typical input sensitivity for a D-type bistable. From FIG. 5 it can be seen that the hysteresis level for a D-type bistable is about 4 mV between 200 and 850 MHz. This level is about ten times lower than that for a Schmidt Trigger.

Figure 6:
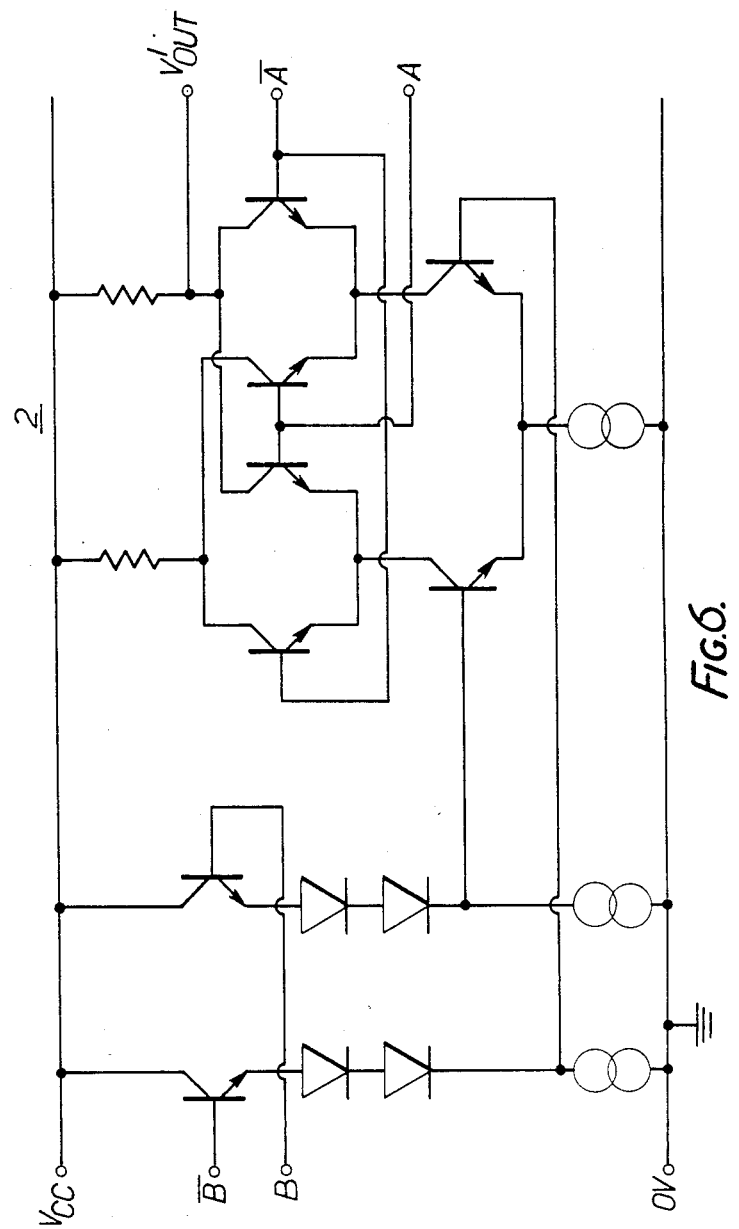
FIG. 6 is a circuit diagram of a ×2 multiplier of the amplitude variation suppression arrangement of FIG. 3.

FIG. 6 shows a circuit diagram of the ×2 multiplier 2 of FIG. 3, the operation of which is well known. The frequency divided signals from the terminals $A\overline{A}$ and $B\overline{B}$ of the frequency divider 1 are fed into the multiplier 2 at corresponding terminals $A\overline{A}$ and $B\overline{B}$. The multiplier 2 combines the two frequency divided signals of substantially constant amplitude to produce an output signal of substantially constant amplitude and having a frequency equal to the input FM signal at a terminal $V'_{OUT}$.

I claim:

1. An arrangement for suppressing amplitude variation in FM signals, the arrangement comprising:
   frequency divider means for frequency dividing an incoming FM signal of varying amplitude when the amplitude of the FM incoming signal is above a threshold value to provide first and second frequency divided signals each having two discrete levels and being of substantially constant amplitude; and
   frequency multiplier means coupled to the frequency divider means for receiving the first and second frequency divided signals and multiplying the first and second frequency divided signals to provide an output signal of substantially constant amplitude and having a frequency equal to that of the incoming signal.

2. An arrangement according to claim 1, wherein the frequency divider means is in the form of a D-type bistable operative to frequency divide the incoming FM signal by two to provide said first and second frequency divided signals in phase quadrature with respect to one another.

* * * * *